United States Patent
Schamber et al.

(10) Patent No.: US 11,536,745 B2
(45) Date of Patent: Dec. 27, 2022

(54) ELECTRIC METER INSTALLATION ISSUE DETECTION BASED ON ORIENTATION CHANGE

(71) Applicant: Landis+Gyr Innovations, Inc., Alpharetta, GA (US)

(72) Inventors: David Schamber, Lafayette, IN (US); David Stenberg, West Lafayette, IN (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 365 days.

(21) Appl. No.: 16/823,133

(22) Filed: Mar. 18, 2020

(65) Prior Publication Data

US 2021/0293853 A1 Sep. 23, 2021

(51) Int. Cl.
*G01R 11/25* (2006.01)
*G06Q 50/06* (2012.01)
(Continued)

(52) U.S. Cl.
CPC .......... *G01R 11/25* (2013.01); *G01P 15/0802* (2013.01); *G01R 11/04* (2013.01); *G06Q 50/06* (2013.01)

(58) Field of Classification Search
CPC ......... G01R 11/02; G01R 11/04; G01R 11/25; G01R 22/06; G01R 22/061; G01R 22/066; G01R 22/068; G06Q 50/06
See application file for complete search history.

(56) References Cited

U.S. PATENT DOCUMENTS 6,615,147 B1 9/2003 Jonker et al.
6,816,360 B2 11/2004 Brooksby et al.
(Continued)

FOREIGN PATENT DOCUMENTS

CN 104269015 1/2017
CN 108072778 5/2018
(Continued)

OTHER PUBLICATIONS

International Patent Application No. PCT/US2021/020886, International Search Report and Written Opinion dated Jul. 6, 2021, 10 pages.

*Primary Examiner* — Huy Q Phan
*Assistant Examiner* — David B Frederiksen
(74) *Attorney, Agent, or Firm* — Kilpatrick Townsend & Stockton LLP

(57) ABSTRACT

A method for detecting electric meter installation issues includes: determining an initial orientation of an electric meter based on initial acceleration measurements from an accelerometer positioned in the electric meter. Subsequent acceleration measurements from the accelerometer may be continuously monitoring, and a subsequent orientation of the electric meter may be determined based on the subsequent acceleration measurements. A difference between the initial orientation and the subsequent orientation based on the initial acceleration measurements and the subsequent acceleration measurements may be determined and compared to a threshold value. Based on the difference exceeding the threshold value, a notification of a change in orientation of the electric meter may be generated to a head-end system.

20 Claims, 7 Drawing Sheets

US 11,536,745 B2
Page 2

(51) Int. Cl.
 *G01R 11/04* (2006.01)
 *G01P 15/08* (2006.01)

(56) References Cited

U.S. PATENT DOCUMENTS

| | | | |
|---|---|---|---|
| 7,135,850 B2 | 11/2006 | Ramirez | |
| 7,469,190 B2 | 12/2008 | Bickel | |
| 7,693,670 B2 | 4/2010 | Durling et al. | |
| 7,990,806 B2 | 8/2011 | Chen | |
| 8,004,933 B2 | 8/2011 | Iseli | |
| 8,121,741 B2 | 2/2012 | Taft et al. | |
| 8,223,466 B2 | 7/2012 | Roscoe | |
| 8,322,215 B2 | 12/2012 | Lakich et al. | |
| 8,326,554 B2 | 12/2012 | Caird | |
| 8,635,036 B2 | 1/2014 | Pamulaparthy et al. | |
| 8,754,634 B2 | 6/2014 | Chamarti et al. | |
| 8,830,083 B2 | 9/2014 | LaFrance et al. | |
| 8,854,217 B2 | 10/2014 | Brown et al. | |
| 8,947,246 B2 | 2/2015 | Aiken | |
| 8,978,443 B2 | 3/2015 | Ramirez | |
| 8,996,144 B2 | 3/2015 | LaFrance et al. | |
| 9,164,135 B2 | 10/2015 | Cs et al. | |
| 9,304,014 B2 | 4/2016 | Komati et al. | |
| 9,341,686 B2 | 5/2016 | Deak et al. | |
| 9,476,740 B2 | 10/2016 | Zigovszki et al. | |
| 9,557,392 B2 | 1/2017 | Schuhl et al. | |
| 9,602,895 B2 | 3/2017 | Bowling et al. | |
| 9,671,254 B2 | 6/2017 | Zigovszki et al. | |
| 9,887,051 B2 | 2/2018 | LaFrance et al. | |
| 9,891,088 B2 | 2/2018 | Zigovszki et al. | |
| 10,240,961 B2 | 3/2019 | Cheng et al. | |
| 10,254,315 B2 | 4/2019 | Higashi et al. | |
| 10,295,578 B2 | 5/2019 | Higashi et al. | |
| 2007/0103334 A1* | 5/2007 | Soni | G01D 4/002 340/870.02 |
| 2012/0060606 A1 | 3/2012 | Lakich et al. | |
| 2013/0285224 A1* | 10/2013 | Takemasa | H01L 23/3107 257/676 |
| 2014/0283622 A1* | 9/2014 | Namiki | B62M 3/00 73/862.53 |
| 2016/0049943 A1* | 2/2016 | Iwasa | H03B 5/04 257/676 |
| 2016/0084632 A1* | 3/2016 | Zigovszki | G01D 9/005 324/207.11 |
| 2016/0351028 A1 | 12/2016 | Brennan et al. | |
| 2018/0052008 A1 | 2/2018 | Maman et al. | |
| 2018/0073910 A1 | 3/2018 | Deak et al. | |
| 2018/0106640 A1 | 4/2018 | Padrones et al. | |
| 2018/0109047 A1* | 4/2018 | Hoang | H01R 13/73 |
| 2019/0041439 A1 | 2/2019 | Brown | |
| 2019/0094329 A1 | 3/2019 | Minich | |
| 2019/0101411 A1 | 4/2019 | Davis et al. | |
| 2019/0219618 A1 | 7/2019 | Davis et al. | |

FOREIGN PATENT DOCUMENTS

| | | |
|---|---|---|
| CN | 108107249 | 6/2018 |
| WO | 2018072030 | 4/2018 |
| WO | 2018083902 | 5/2018 |
| WO | 2019026791 | 2/2019 |

* cited by examiner

ELECTRIC METER INSTALLATION ISSUE DETECTION BASED ON ORIENTATION CHANGE

BACKGROUND

Unless otherwise indicated herein, the materials described in this section are not prior art to the claims in this application and are not admitted to be prior art by inclusion in this section.

An electric meter measures electrical power consumed by a customer of an electric utility provider. The electric meter is plugged into a meter socket that is mounted in an enclosure on a pole, a building, or other structure. The electrical connection between the electric meter and the socket is formed with a series of male connectors, sometimes referred to as "blades," which are received by a corresponding series of female connectors, also referred to as jaws. When an electric meter is installed at a customer premises, the electric meter is oriented such that a front face of the electric meter is parallel to the vertical mounting surface (e.g., the meter is plumb).

One issue that utilities face is unreported damage to their assets, of which one such asset is the electric meter. A further challenge for utilities is that many meter installations (meter bases and load side wiring) are the property of the energy consumer (e.g., home owner or landlord). Damage to meter installations can occur suddenly in the case of storm or vehicle damage or slowly in the case of earth settling or heaving over many years and may not be noticed or reported by the energy consumer. Improper orientation can be an indication of damage to the electric meter or the electric meter installation.

SUMMARY

Systems and methods for detecting changes in the orientation of an electric meter are provided.

According to various aspects of the present disclosure there is provided a method. In some aspects, the method may include: determining an initial orientation of an electric meter based on initial acceleration measurements from an accelerometer positioned in the electric meter; continuously monitoring subsequent acceleration measurements from the accelerometer; determining a subsequent orientation of the electric meter based on the subsequent acceleration measurements; determining a difference between the initial orientation and the subsequent orientation based on the initial acceleration measurements and the subsequent acceleration measurements; comparing the difference to a threshold value; determining that the difference exceeds the threshold value; and based on the difference exceeding the threshold value, generating a notification of a change in orientation of the electric meter to a head-end system. Further, when the difference exceeds the threshold value, a timestamped event may be recorded and an alarm flag may be set.

In some cases, determining the initial orientation of the electric meter may include executing a firmware procedure to initiate the initial accelerometer measurements on the electric meter during installation. In some cases, determining the initial orientation of the electric meter may include initiating the initial accelerometer measurements from the accelerometer by the electric meter when the electric meter first registers on a network and transitions to an operational mode at an installation site.

Continuously monitoring the subsequent acceleration measurements from the accelerometer may include receiving acceleration measurements from the accelerometer at predetermined time intervals.

In some cases, determining a difference between the initial orientation and the subsequent orientation comprises determining a difference between the initial acceleration measurements and the subsequent acceleration measurements. In some cases, determining a difference between the initial orientation and the subsequent orientation may include determining an initial tilt angle of the electric meter based on the initial acceleration measurements, determining a subsequent tilt angle of the electric meter based on the subsequent acceleration measurements, and comparing the initial tilt angle to the subsequent tilt angle.

The method may further include determining a tilt angle difference of the electric meter at the predetermined time intervals when the acceleration measurements from the accelerometer are received. The tilt angle of the electric meter may be an angle in a front-to-back direction with respect to a front face of the electric meter, an angle in a side-to-side direction with respect to a front face of the electric meter, or an angle in a rotation direction around a vertical axis of the electric meter.

According to various aspects of the present disclosure there is provided an electric meter. In some aspects, the electric meter may include an accelerometer and a processor. The accelerometer may be configured to obtain initial acceleration measurements of the electric meter due to gravity; and obtain subsequent acceleration measurements of the electric meter due to gravity over time.

The processor may be in communication with the accelerometer, and may be configured to receive the initial acceleration measurements and the subsequent acceleration measurements from the accelerometer; determine an initial orientation of the electric meter based on the initial acceleration measurements; determine a subsequent orientation of the electric meter based on the subsequent acceleration measurements; determine a difference between the initial orientation and the subsequent orientation based on the initial acceleration measurements and the subsequent acceleration measurements; compare the difference to a threshold value; determine that the difference exceeds the threshold value; and based on the difference exceeding the threshold value, generate a notification of a change in orientation of the electric meter to a head-end system. Further, when the difference exceeds the threshold value, a timestamped event may be recorded and an alarm flag may be set.

In some cases, the processor of the electric meter may be further configured to determine a difference between the initial orientation and the subsequent orientation by determining a difference between the initial acceleration measurements and the subsequent acceleration measurements. In some cases, the processor of the electric meter may be further configured to determine a difference between the initial orientation and the subsequent orientation by: determining an initial tilt angle of the electric meter based on the initial acceleration measurements, determining a subsequent tilt angle of the electric meter based on the subsequent acceleration measurements, and comparing the initial tilt angle to the subsequent tilt angle.

The processor may be further configured to receive the subsequent acceleration measurements at predetermined time intervals, and may be further configured to determine a tilt angle difference at the predetermined time intervals when the acceleration measurements from the accelerometer are received. The tilt angle of the electric meter may be an angle in a front-to-back direction with respect to a front face of the electric meter, an angle in a side-to-side direction with respect to a front face of the electric meter, or an angle in a rotation direction around a vertical axis of the electric meter.

According to various aspects of the present disclosure there is provided a system. In some aspects, the system may include: a head-end system and in electric meter. The head-end system may include a server, and of the electric meter may be in communication with the head-end system. The electric meter may include an accelerometer and a processor. The accelerometer may be configured to obtain initial acceleration measurements of the electric meter due to gravity; and obtain subsequent acceleration measurements of the electric meter due to gravity over time.

The processor may be in communication with the accelerometer, and may be configured to: receive the initial acceleration measurements and the subsequent acceleration measurements from the accelerometer; determine an initial orientation of the electric meter based on the initial acceleration measurements; determine a subsequent orientation of the electric meter based on the subsequent acceleration measurements; determine a difference between the initial orientation and the subsequent orientation based on the initial acceleration measurements and the subsequent acceleration measurements; compare the difference to a threshold value; determine that the difference exceeds the threshold value; and based on the difference exceeding the threshold value, generate a notification of a change in orientation of the electric meter to the server of the head-end system. Further, when the difference exceeds the threshold value, a timestamped event may be recorded and an alarm flag may be set.

In some cases, the processor may be further configured to determine a difference between the initial orientation and the subsequent orientation by determining a difference between the initial acceleration measurements and the subsequent acceleration measurements. In some cases, the processor may be further configured to determine a difference between the initial orientation and the subsequent orientation by: determining an initial tilt angle of the electric meter based on the initial acceleration measurements, determining a subsequent tilt angle of the electric meter based on the subsequent acceleration measurements, and comparing the initial tilt angle to the subsequent tilt angle.

The processor may be further configured to receive the subsequent acceleration measurements at predetermined time intervals, and may be further configured to determine a tilt angle difference at the predetermined time intervals when the acceleration measurements from the accelerometer are received.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Embodiments according to the present disclosure can detect possible changes to orientations of electric meter installations. Changes such as tilting of an electric meter from an initial orientation when the electric meter was installed can create safety or power quality issues. For example, changes to the orientation of the electric meter installation could create strain on electrical conductors or connectors, or even expose the electrical conductors resulting in shock or fire hazards. Detection of changes in the orientation of the electric meter installation can prevent loss of life as well as damage to structures and electrical equipment.

Figure 1:
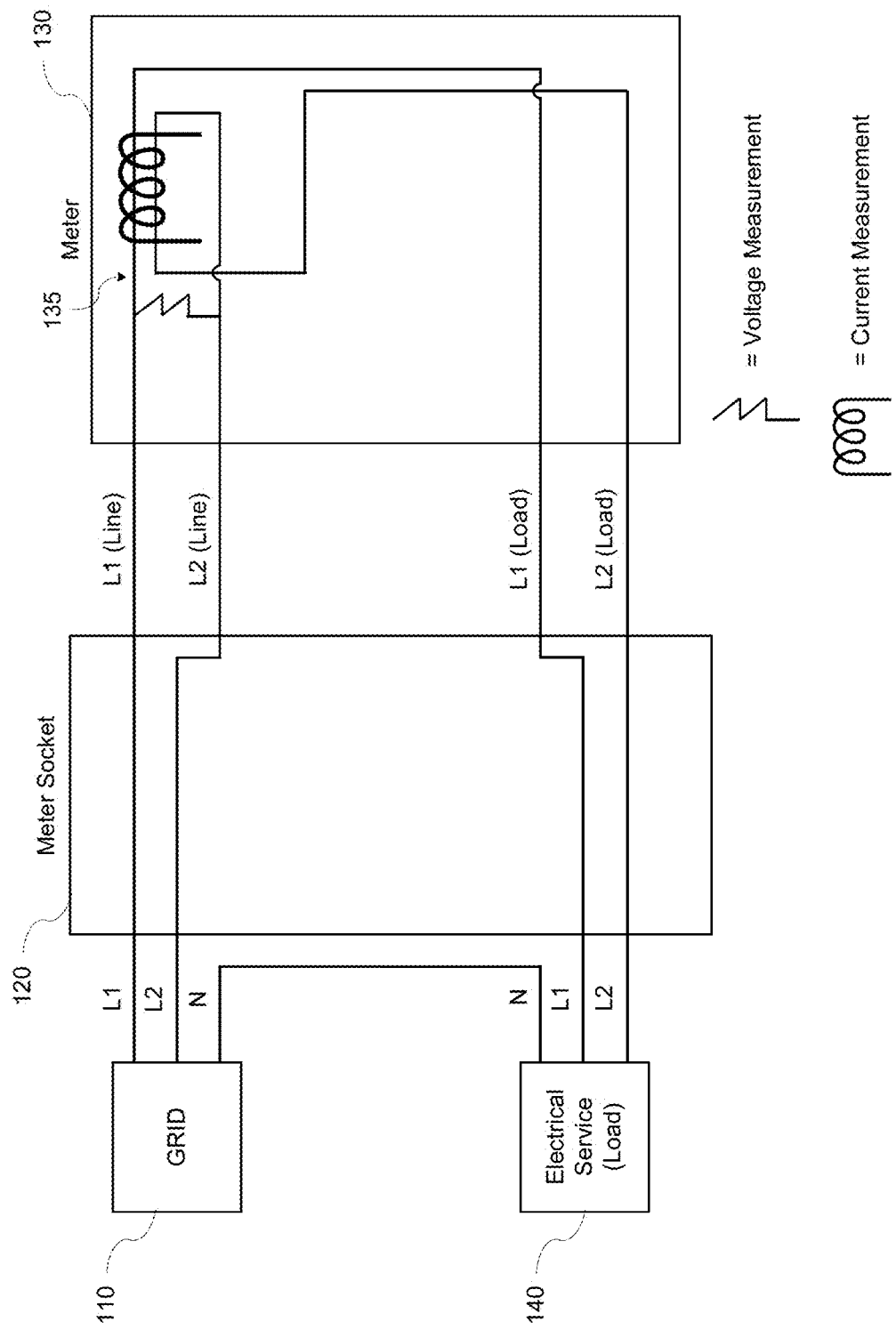
FIG. 1 is a block diagram illustrating electrical connections to an electric meter and meter socket some aspects of the present disclosure.

FIG. 1 is a block diagram illustrating electrical connections to an electric meter and meter socket. The meter and meter socket are located at the customer premises. The meter measures and controls the electricity delivered to the customer premises via the electric distribution system (i.e., the grid). The meter may be combined with a communications module to enable the meter to communicate with other meters and with the utility. As illustrated in FIG. 1, power from the grid 110 (i.e., the electric distribution system) is supplied to the meter socket 120 via electrical wiring L1 and L2. Electrical wiring L1 and L2 may provide power from two phases of the grid. The neutral wire N, sometimes referred to as ground, is connected between the grid 110 and the electrical service 140, for example, at an electrical service panel at a residential or commercial customer premises. In some installations, the neutral wire N may not have a connection within the meter socket. In other installations, the neutral wire N may be connected within the meter socket.

The electrical service 140 is also connected to the meter socket 120 via corresponding electrical wiring L1 and L2. The meter socket 120 includes electrical connectors to provide electrical connections to the meter 130 when the meter 130 is plugged into the meter socket 120. An electrical connection between the grid 110 and the electrical service 140 is formed through the meter 130 when the meter 130 is plugged into the meter socket 120. Within the meter 130, voltage and current provided by the grid 110 to the electrical service 140 is measured, or metered, by measuring devices 135, for example, voltage transformers and current transformers. Power delivered to the electrical service 140 may be calculated based on the voltage and current measurements.

Figure 2:
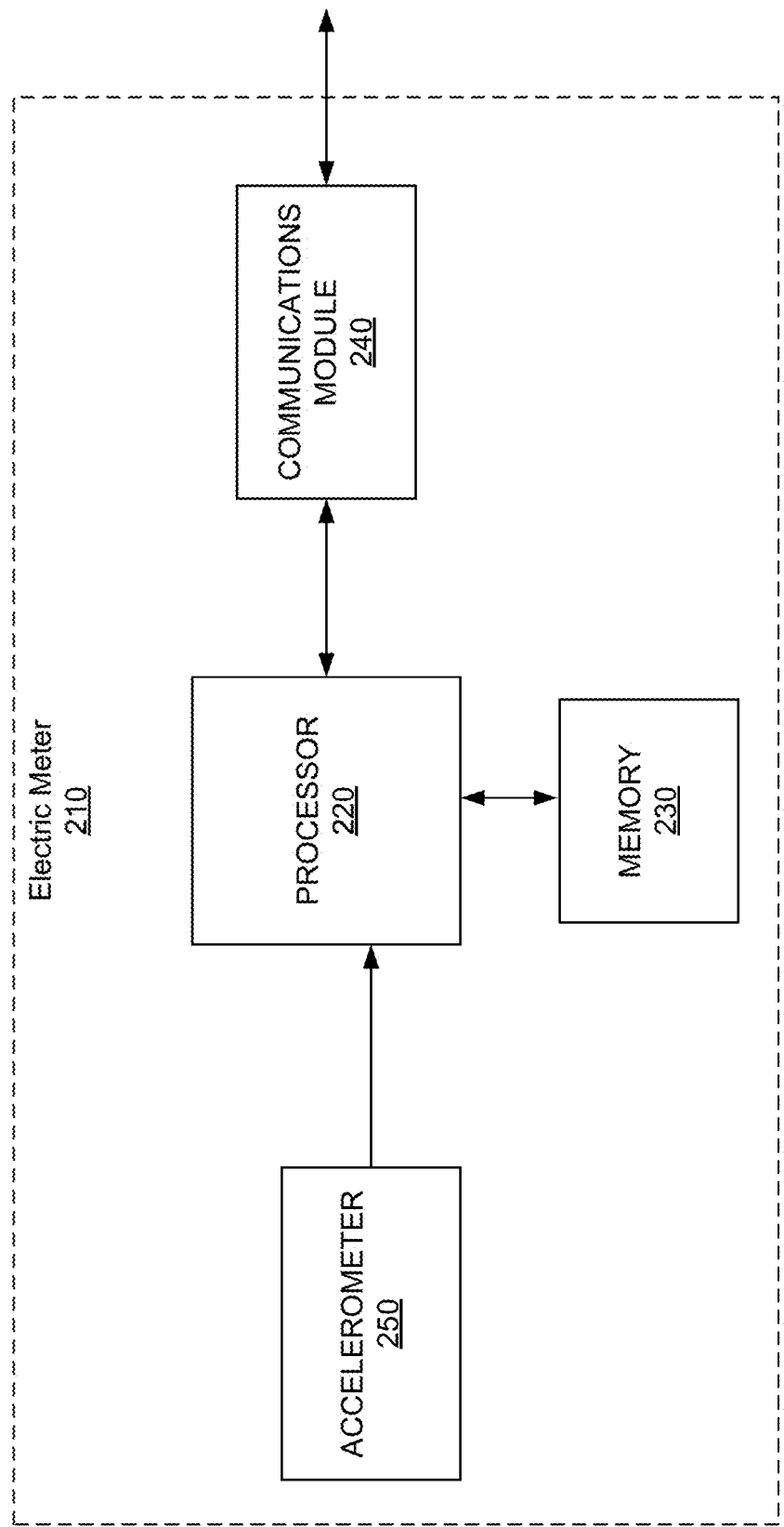
FIG. 2 is a block diagram illustrating an example implementation of an electric meter.

FIG. 2 is a block diagram illustrating an example implementation of an electric meter according to aspects of the present disclosure. Referring to FIG. 2, the electric meter 210 may include a processor 220, a memory 230, an accelerometer 250, and a communications module 240.

The processor 220 may be a general purpose processor, a digital signal processor (DSP), an application specific integrated circuit (ASIC), a field programmable gate array (FPGA) or other programmable logic device. The processor 220 may be in electrical communication with the accelerometer 250, the memory 230, and the communications module 240, and may control overall operation of the electric meter 210. The processor 220 may receive data generated by various sensors of the electric meter 210 including, but not limited to, data generated by the accelerometer 250 and may perform operations on, or processing of, the data. In some implementations, the data generated by the accelerometer 250 may be timestamped by the accelerometer 250 or the processor 220. In some implementations, the accelerometer data may not include a timestamp.

The memory 230 may be a storage device such as a solid state storage device or other storage device, and may be a combination of volatile and non-volatile storage or memory. In some implementations, portions of the memory may be included in the processor 220. The memory 230 may be configured to store instructions executable by the processor 220 as well as data generated by various sensors of the electric meter 210 including, but not limited to, data generated by the accelerometer 250.

In accordance with aspects of the present disclosure, when the electric meter 210 is installed in a meter socket, the accelerometer 250 may monitor vibrations experienced by the electric meter 210. The processor 220 may receive timestamped data from the accelerometer 250 or may receive and timestamp the accelerometer data. In some implementations, the processor 220 may cause the timestamped accelerometer data to be stored, for example in the memory 230 or other storage. The accelerometer data may be stored for a specified period of time.

The communications module 240 may be a wired or wireless transceiver operable to communicate via various wired or wireless protocols as known in the field. The communications module 240 may enable the electric meter 210 to communicate with other meters and with the utility provider, for example, with a head-end system. The communications module may be, for example, a radio frequency (RF) transceiver configured to wirelessly communicate with a head-end system and other electric meters and devices in a communications network. Many technologies are available for RF communications, for example, but not limited to, Cat-M, Cat-1, NB-IoT, ZigBee, Bluetooth, Wi-Fi, Wi-SUN, and cellular, as well as proprietary protocols, and the technologies may use many different frequencies.

The head-end system may be, for example, a server situated in an office location of a utility provider. The head-end system may communicate with the electric meters to collect meter identification information such as serial numbers, advanced metering infrastructure (AMI) identifiers, other utility-specific identifiers, as well as data generated by the electric meters such as global positioning system (GPS) coordinates, voltage and current data, accelerometer data, and notifications. The communications module 240 may transmit data and alarm signals to the utility provider head-end system and receive any of updated program instructions, firmware updates, updates to other settings, or other communications.

The accelerometer 250 may be a 2-axis accelerometer, a 3-axis accelerometer, or other accelerometer. The accelerometer 250 may be operable to detect static acceleration due to gravity. By measuring the amount of static acceleration due to gravity, the accelerometer 250 or the processor 220 can determine the angle the electric meter 210 is tilted at with respect to the earth. In some implementations, the accelerometer 250 may be operable to detect vibrations in a range of several hertz to several hundred hertz. Thus, the accelerometer 250 may detect vibrations due to insertions and removals of the electric meter.

When an electric meter is installed at a customer premises, for example, on a vertical mounting surface such as pole or on a side of a building, the electric meter is oriented such that a front face of the electric meter is substantially parallel to the vertical mounting surface (e.g., the meter is plumb). The electric meter is thus considered to be mounted in a vertical orientation. Measurements from an accelerometer, for example, the accelerometer 250, positioned in the electric meter can be used to determine the orientation of the electric meter with respect to gravity when the electric is installed.

In some example embodiments, initial orientation measurements may be obtained from the accelerometer by causing the electric meter to execute a firmware procedure. The firmware procedure may be initiated by a technician and may cause the accelerometer to perform the static acceleration measurements, and the initial orientation determination may be performed by the accelerometer and/or the processor of the electric meter based on the accelerometer signals. In some embodiments, the initial orientation measurements may be initiated by the electric meter when the electric meter registers with the utility provider network and transitions to an operational mode at the installation site.

The accelerometer measurements obtained when the electric meter is installed may be stored, for example, in the memory 230 of the electric meter, as the baseline orientation. Alternatively or initially, the processor of the electric meter may cause the baseline orientation to be communicated to the head-end system via the communications module. The baseline accelerometer measurements may be compared with subsequently obtained accelerometer measurements to determine whether the orientation of the electric meter has changed. In some cases, the baseline accelerometer measurements may be compared directly with subsequently obtained accelerometer measurements. In other cases, tilt angles of the electric meter determined based on the baseline accelerometer measurements and tilt angles of the electric meter determined based on the subsequently obtained accelerometer measurements may be compared.

Figure 3:
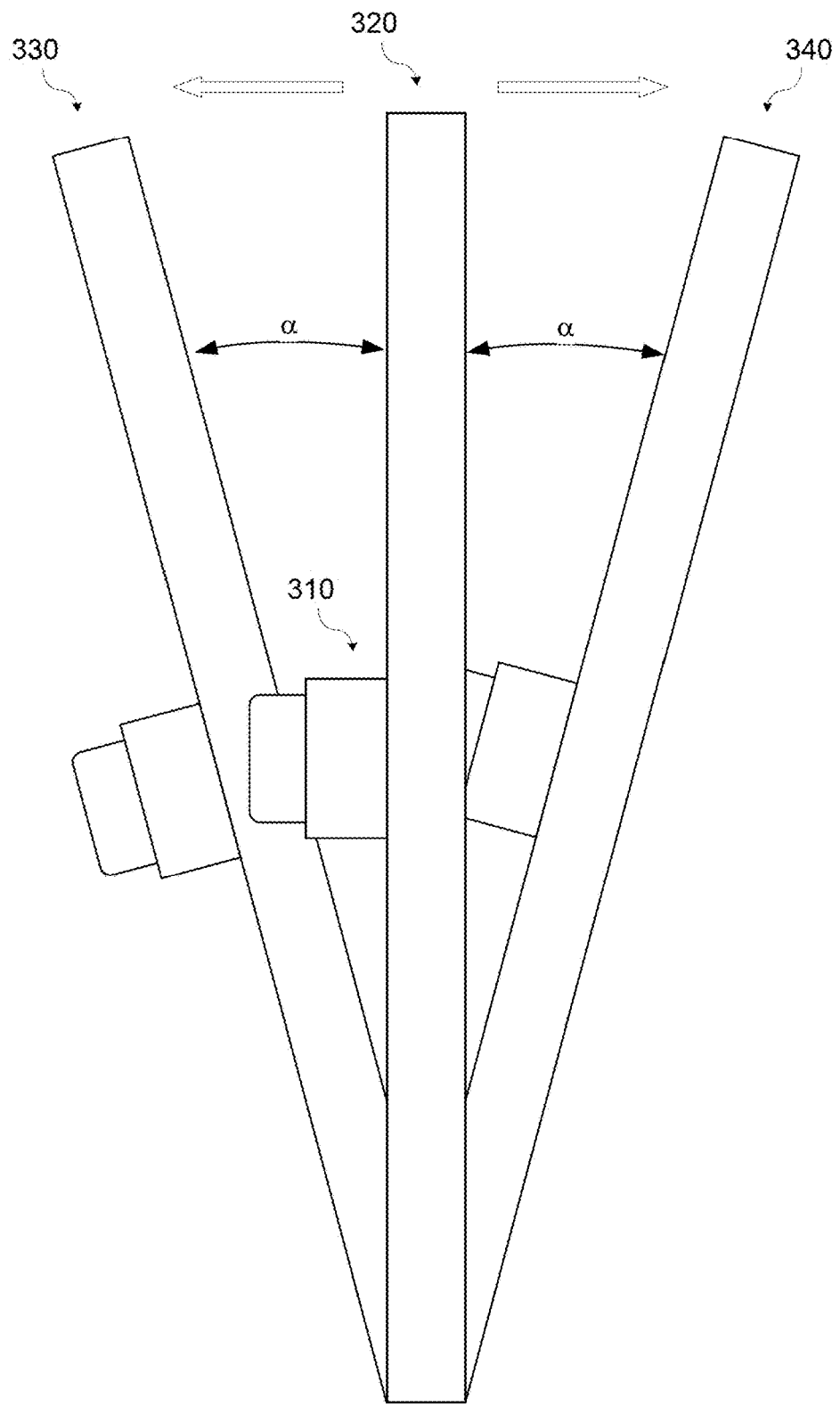
FIG. 3 is a diagram illustrating a change in electric meter orientation in a front-to-back direction.

FIG. 3 is a diagram illustrating a change in electric meter orientation in a front-to-back direction. Referring to FIG. 3, in an initial installation 320, an electric meter 310 may be installed in a substantially vertical orientation. Measurements may be obtained from the accelerometer positioned in the electric meter to establish a baseline orientation of the electric meter in the front-to-back (e.g., pitch) direction with respect to a front face of the electric meter. In some examples, the processor of the electric meter may receive the accelerometer measurements and determine the baseline orientation of the electric meter in the front-to-back direction. In some examples, the accelerometer may determine the baseline orientation of the electric meter in the front-to-back direction from the obtained measurements and communicate the baseline orientation to the processor.

The electric meter orientation in the front-to-back direction may be determined as a tilt angle $\alpha$ (e.g., a difference angle from a true vertical direction) of the electric meter. The baseline front-to-back orientation measurements may be stored, for example, in the memory of the electric meter.

Alternatively or additionally, the processor may cause the communications module to communicate the baseline front-to-back orientation measurements to the head end system.

In some example embodiments, the accelerometer may continuously measure the front-to-back orientation of the electric meter and communicate the measurements or the determined front-to-back orientation to the processor. In some example embodiments, the accelerometer may measure the front-to-back orientation of the electric meter at predetermined time intervals, for example, periods of seconds, minutes, hours, days, etc., and communicate measurements or the front-to-back orientation of the electric meter to the processor.

Various external conditions, for example, high wind, structural deterioration, vehicle impact, land settling, etc., can cause the orientation of the electric meter to tilt in a forward direction 330 or backward direction 340 with respect to a frame of reference of the electric meter 310. In some cases, the change in orientation may be sudden, for example, as a result of a vehicle impact with a pole or wall on which the electric meter 310 is mounted. In some cases, the change in orientation may occur over a period of time, for example, as the land around the electric meter 310 settles. The accelerometer positioned in the electric meter 310 can detect the changes in orientation by determining a change in magnitude of a gravity vector measured along the appropriate axes.

Figure 4:
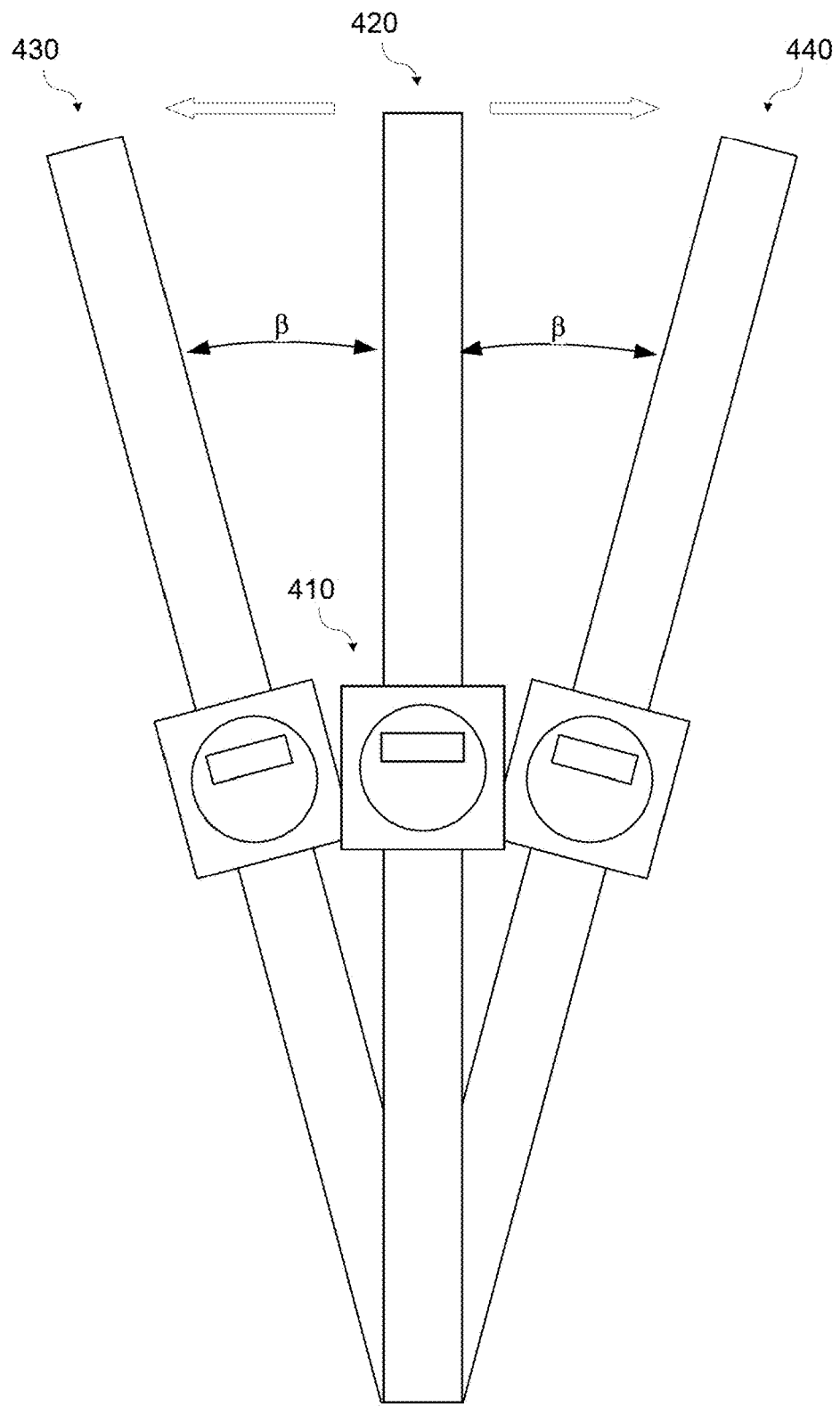
FIG. 4 is a diagram illustrating a change in electric meter orientation in a side-to-side direction.

FIG. 4 is a diagram illustrating a change in electric meter orientation in a side-to-side direction. Referring to FIG. 4, in an initial installation 420, an electric meter 410 may be installed in a substantially vertical orientation. Measurements may be obtained from the accelerometer positioned in the electric meter to establish a baseline orientation of the electric meter in the side-to-side (e.g., roll) direction with respect to a front face of the electric meter. In some examples, the processor of the electric meter may receive the accelerometer measurements and determine the baseline orientation of the electric meter in the side-to-side direction. In some examples, the accelerometer may determine the baseline orientation of the electric meter in the side-to-side direction from the obtained measurements and communicate the baseline orientation to the processor.

The electric meter orientation in the side-to-side direction may be determined as a tilt angle $\beta$ (e.g., a difference angle from a true vertical direction) of the electric meter. The baseline side-to-side orientation measurements may be stored, for example, in the memory of the electric meter. Alternatively or additionally, the processor may cause the communications module to communicate the baseline side-to-side orientation measurements to the head end system.

In some example embodiments, the accelerometer may continuously measure the side-to-side orientation of the electric meter and communicate the measurements or the determined side-to-side orientation of the electric meter to the processor. In some example embodiments, the accelerometer may measure the side-to-side orientation of the electric meter at predetermined time intervals, for example, periods of seconds, minutes, hours, days, etc., and communicate measurements or the side-to-side orientation to the processor.

Various external conditions, for example, high wind, structural deterioration, vehicle impact, land settling, etc., can cause the orientation of the electric meter to tilt in a left side direction 430 or right side direction 440 with respect to a frame of reference of the electric meter 410. In some cases, the change in orientation may be sudden, for example, as a result of a vehicle impact with a pole or wall on which the electric meter 410 is mounted. In some cases, the change in orientation may occur over a period of time, for example, as the land around the electric meter 410 settles. The measurements from the accelerometer positioned in the electric meter 410 can detect the changes in orientation by determining a change in magnitude of a gravity vector measured along the appropriate axes.

Figure 5:
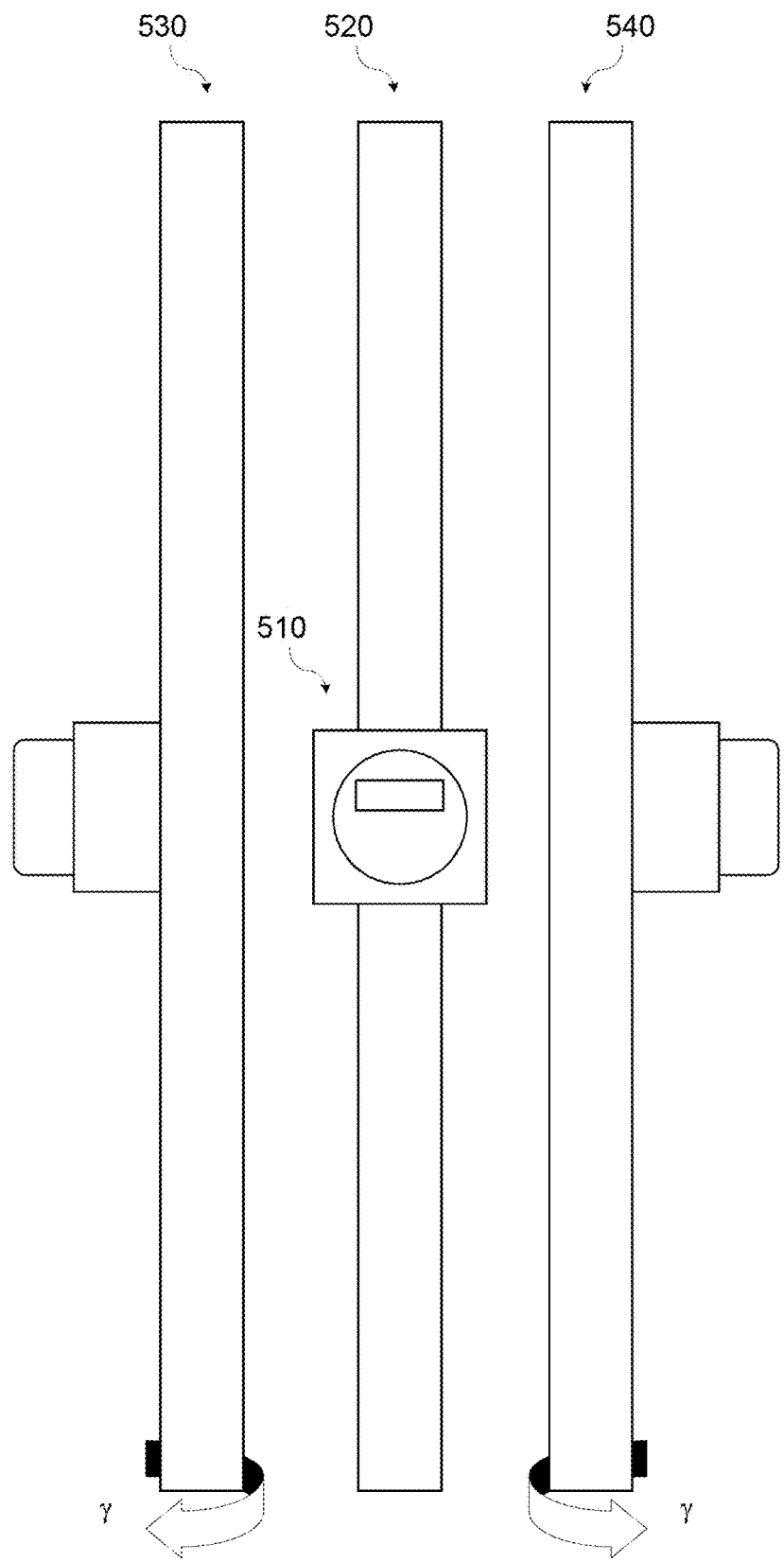
FIG. 5 is a diagram illustrating a change in electric meter orientation in a rotation direction around a vertical axis of the electric meter.

FIG. 5 is a diagram illustrating a change in electric meter orientation in a rotation direction around a vertical axis of the electric meter. Referring to FIG. 5, in an initial installation 520, an electric meter 510 may be installed in a substantially vertical orientation. Measurements may be obtained from the accelerometer positioned in the electric meter to establish a baseline orientation of the electric meter in the rotation (e.g., yaw) rotation direction around the vertical axis of the electric meter. In some examples, the processor of the electric meter may receive the accelerometer measurements and determine the baseline orientation of the electric meter in the rotation direction. In some examples, the accelerometer may determine the baseline orientation of the electric meter in the rotation direction from the obtained measurements and communicate the baseline orientation to the processor.

The electric meter orientation in the rotation direction may be determined as a tilt angle $\gamma$ of the electric meter. The tilt angle $\gamma$ may be taken as an angle of zero degrees rotation around the vertical axis of the electric meter. The baseline rotation orientation measurements may be stored, for example, in the memory of the electric meter. Alternatively or additionally, the processor may cause the communications module to communicate the baseline rotation orientation measurements to the head end system.

In some example embodiments, the accelerometer may continuously measure the rotation orientation of the electric meter and communicate the measurements or the determined rotation orientation of the electric meter to the processor. In some example embodiments, the accelerometer may measure the rotation orientation of the electric meter at predetermined time intervals, for example, periods of seconds, minutes, hours, days, etc., and communicate measurements or the rotation orientation to the processor.

Various external conditions, for example, high wind, structural deterioration, vehicle impact, land settling, etc., can cause the orientation of the electric meter to tilt in a left rotation direction 530 or right rotation direction 540 with respect to a vertical axis of the electric meter 510. In some cases, the change in orientation may be sudden, for example, as a result of a vehicle impact with a pole or wall on which the electric meter 510 is mounted. In some cases, the change in orientation may occur over a period of time, for example, as the land around the electric meter 510 settles. The measurements from the accelerometer positioned in the electric meter 510 can detect the changes in orientation by determining a change in magnitude of a gravity vector measured along the appropriate axes.

According to aspects of the present disclosure, the change in orientation of the electric meter detected by the accelerometer measurements may be compared to a threshold. For example, the processor of the electric meter may receive the accelerometer signals and calculate a tilt angle $\alpha$ in a front-to-back direction, a tilt angle $\beta$ in a side-to-side direction or a tilt angle $\gamma$ in the rotation direction, or tilt angles in all of the front-to-back, side-to-side, and rotation directions compared to the baseline orientation of the electric meter. In some implementations, the threshold value may be specified as a positive value and the absolute values of the tilt angles may be taken for the comparison. In other implementations, the threshold value may be specified as signed values (e.g., ±15 degrees) and the tilt angles compared according to their signed values. When the value of the front-to-back tilt angle α or the side-to side tilt angle β or the rotation tilt angle γ exceeds a threshold, for example 15 degrees or another angle from the baseline orientation of the electric meter, the processor may cause the communications module to generate a notification to the head-end system. The notification may include a timestamped event recorded in a location in the memory (e.g., the memory 230) or in a register in the processor (e.g., the processor 220) and an alarm flag may set in a location in the memory or in a register in the processor. When a notification is generated, a technician may be dispatched to investigate the cause of the notification.

In some cases, the accelerometer signals may indicate oscillations, for example, caused by a pole on which the electric meter is mounted swaying in high winds. The oscillations detected by the accelerometer may be an indication that the electrical wiring connected to the pole may be experiencing excessive strain that may ultimately result in downed wires or other failure conditions. In some embodiments, the electric meter may apply a filter (not shown) to detect and filter out temporary oscillations due to typical wind conditions.

While FIGS. 3-5 illustrate an electric meter installed on a pole, other installations, for example on the wall of a building, may be used without departing from the scope of the present disclosure.

Figure 6:
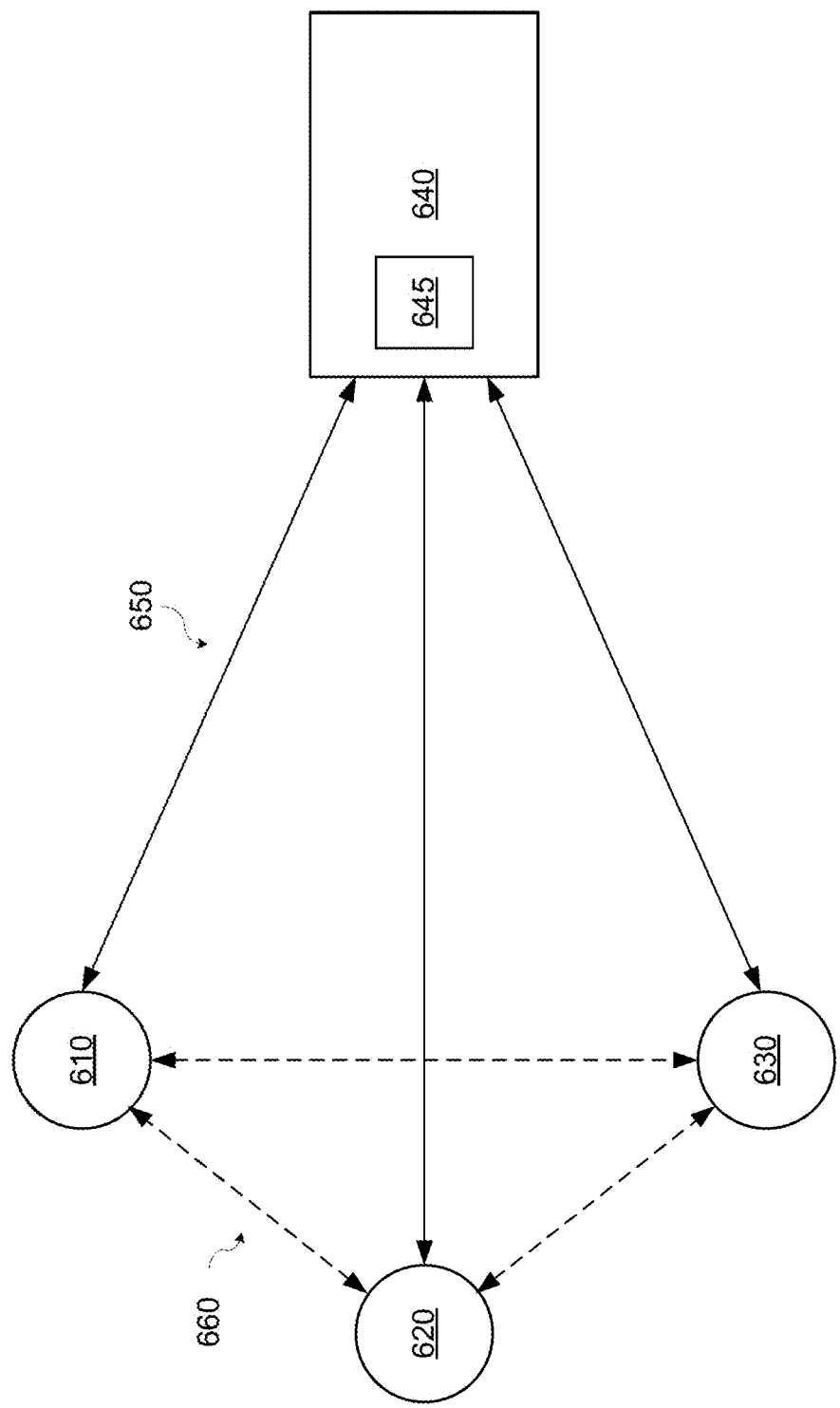
FIG. 6 is a block diagram illustrating communications between electric meters and a head end system according to some aspects of the present disclosure.

FIG. 6 is a block diagram illustrating communications between electric meters and a head end system according to some aspects of the present disclosure. Referring to FIG. 6, electric meters 610, 620, 630 may be in communication with a head-end system 640 via communication links 650 and may be in communication with each other via communication links 660. The head-end system 640 may include a server 645 configured to communicate with electric meters 610, 620, 630 over a network, for example in Advanced Metering Infrastructure (AMI) network. Each electric meter 610, 620, 630 may communicate meter information and data with other electric meters and with the server 645 in the head end system 640. In some cases, an electric meter, for example electric meter 620, may be too remote from the head-end system 640 to communicate with it directly. In such cases, the electric meter 620 may communicate with the head-end system 640 via another electric meter, for example electric meter 610.

In some cases, communications between electric meters and the head-end system may be communicated through additional networks (not shown). Additionally or alternatively, the electric meters may communicate with one or more edge processing device located topologically closer to the electric meters than to the head-end system. The edge processing device may have more processing capability than the electric meters and may provide some of the functionality typically provided by the head-end system.

The electric meters 610, 620, 630 may communicate with each other via communication links 660 to exchange meter information and data. For example, if electric meter 610 experiences a loss of line voltage, electric meter 610 may communicate with electric meter 620 and electric meter 630 to determine if the failure is local to electric meter 610 or whether the failure is a more widespread fault caused by a common condition. A common condition may be, for example, downed power lines due to a storm. The common condition may then be reported to the head-end system by one or more of the electric meters. Additionally or alternatively, an edge processing device may receive data from the electric meters and determine whether the data indicates a common condition affecting the electric meters.

Figure 7:
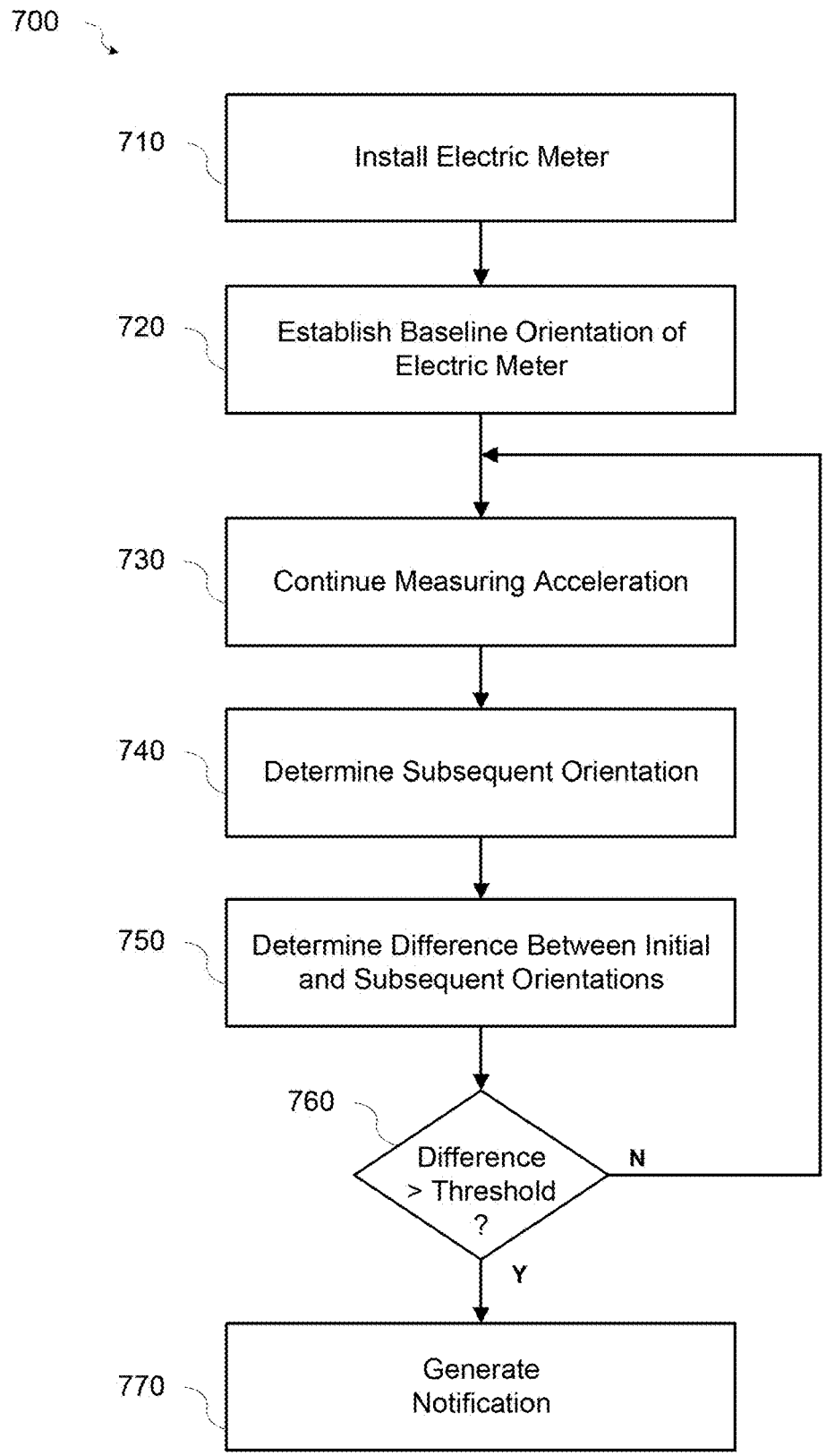
FIG. 7 is a flowchart illustrating a method for measuring tilt of an electric meter according to some aspects of the present disclosure.

FIG. 7 is a flowchart illustrating a method 700 for measuring tilt of an electric meter according to some aspects of the present disclosure. Referring to FIG. 7, at block 710, an electric meter may be installed at a customer premises. For example, the electric meter may be installed on a pole or on the wall of a building or other structure. The electric meter may be installed in a substantially vertical orientation such that a front face of the electric meter is substantially parallel to the vertical mounting surface (e.g., the meter is plumb). The electric meter is thus considered to be mounted in a vertical orientation.

At block 720, a baseline orientation of the electric meter may be established. An accelerometer positioned in the electric meter may be operable to detect static acceleration of the electric meter due to gravity. By measuring the amount of static acceleration due to gravity, the angle that the electric meter is tilted at with respect to the earth can be determined when the electric meter is installed at the customer premises. For example, the accelerometer measurements may be received by the processor of the electric meter, and the processor may perform calculations to determine a tilt angle. Alternatively, the accelerometer may perform the calculations to determine a tilt angle based on the measurements and communicate the tilt angle to the processor of the electric meter.

The accelerometer measurements or the tilt angle or both obtained at installation of the electric meter may be stored in the memory of the electric meter as the baseline orientation. Alternatively or initially, the processor of the electric meter may cause the baseline orientation to be communicated to the head-end system via the communications module. The baseline orientation may be established in the front-to-back (e.g., pitch) direction, the side-to-side (e.g., roll) direction, and the rotation (e.g., yaw) direction of the electric meter as illustrated in and explained with respect to FIGS. 3-5.

At block 730, acceleration of the electric meter due to gravity may continue to be measured. After installation, the accelerometer positioned in the electric meter may continue to measure the acceleration due to gravity of the electric meter in both the front-to-back (e.g., pitch), side-to-side (e.g., roll), and rotation (e.g., yaw) directions. In some example embodiments, the accelerometer may continuously measure the acceleration due to gravity of the electric meter. In some example embodiments, the accelerometer may measure the acceleration due to gravity of the electric meter at predetermined time intervals, for example, periods of seconds, minutes, hours, days, etc. The accelerometer may communicate the measurements to the processor of the electric meter.

At block 740, a subsequent orientation of the electric meter may be determined. The subsequent orientation of the electric meter may be determined based on the subsequent acceleration measurements. The accelerometer measurements may be received by the processor of the electric meter, and the processor may perform calculations to determine a tilt angle of the electric meter. Alternatively, the accelerometer may perform the calculations to determine a tilt angle based on the measurements and communicate the tilt angle to the processor of the electric meter. A tilt angle may be determined in both the front-to-back direction, side-to-side direction, and rotation direction of the electric meter.

At block 750, a difference between the initial and subsequent orientations of the electric meter may be determined. In some example embodiments, the processor may compare the tilt angles based on the subsequent accelerometer measurements to the tilt angles of the baseline orientation (e.g., the front-to-back, side-to-side, and rotation tilt angles at the time of electric meter installation). In some example embodiments, the processor of the electric meter may compare the subsequent accelerometer measurements with the accelerometer measurements obtained at the time of electric meter installation without calculating tilt angles.

At block 760, the tilt angles or acceleration measurements may be compared to threshold values. The processor of the electric meter may determine whether the absolute value of the difference in the front-to-back tilt angle (e.g., the angle $\alpha$ in FIG. 3) or the difference in the side-to-side tilt angle (e.g., the angle $\beta$ in FIG. 4) or the rotation tilt angle e.g., the angle $\gamma$ in FIG. 5) or all of the tilt angles exceeds the threshold value. The threshold value may be a difference in angle of, for example, 15 degrees or another angle from the baseline orientation. The threshold value for the front-to-back orientation, the side-to-side orientation, and the rotation orientation directions of the electric meter may be the same as or different. In some implementations, the threshold value may be specified as a positive value and the absolute values of the tilt angles may be taken for the comparison. In other implementations, the threshold value may be specified as signed values (e.g., ±15 degrees) and the tilt angles compared according to their signed values. In some embodiments, the processor may compare the subsequent accelerometer measurements with the initial accelerometer measurements obtained at the time of electric meter installation without calculating tilt angles. Threshold values may then be specified in terms of a difference in the accelerometer measurements rather than in terms of a tilt angle.

In response to determining that the tilt angles or acceleration measurements do not exceed the threshold value (760-N), the method may continue at block 730. In response to determining that the tilt angles or acceleration measurements exceed the threshold (760-Y), at block 770, a notification may be generated to the head-end system. The notification may be an alarm signal or other indication that the orientation of the electric meter has change beyond an allowable limit. The notification may include a timestamped event recorded in a memory location for example, in a location in the memory (e.g., the memory 230) or in a register in the processor (e.g., the processor 220) and an alarm flag set in a location in the memory or in a register in the processor.

It should be appreciated that the specific steps illustrated in FIG. 7 provide a particular method for measuring tilt of an electric meter installation according to an embodiment of the present disclosure. Other sequences of steps may also be performed according to alternative embodiments. For example, alternative embodiments may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

According to some aspects of the present disclosure, changes in electric meter orientation based on accelerometer measurements may be used to detect tampering with the meter. For example, in some cases, an electric meter may be powered down, carefully removed from its socket, and powered back up such that a typical accelerometer signal signature cannot be detected. Such a situation may occur when, for example, the electric meter is powered back up on a work bench during an attempt to illegally modify the meter. In such cases, the change in orientation of the electric meter detected in accordance with the present disclosure would be notified to the utility provider. For example, a change in any tilt angle exceeding the threshold value accompanied by a loss of voltage may indicate that the electric meter has been removed. The stored energy in the electric meter can provide sufficient power to transmit the notification of meter removal to the head-end system.

The examples and embodiments described herein are for illustrative purposes only. Various modifications or changes in light thereof will be apparent to persons skilled in the art. For example, different types of sensors other than an accelerometer may be used to determine changes in orientation of the electric meter. These are to be included within the spirit and purview of this application, and the scope of the appended claims, which follow.

What is claimed is:

1. A method comprising:
    determining an initial orientation of an electric meter based on initial acceleration measurements from an accelerometer positioned in the electric meter;
    continuously monitoring subsequent acceleration measurements from the accelerometer;
    determining subsequent orientations of the electric meter based on the subsequent acceleration measurements obtained within a specified period of time;
    determining differences between the initial orientation and the subsequent orientations based on the initial acceleration measurements and the subsequent acceleration measurements obtained within the specified period of time;
    comparing the differences to threshold values;
    determining that the differences exceed the threshold values;
    based on the differences exceeding the threshold values, determining that the orientation of the electric meter is oscillating; and
    generating a notification of the oscillating orientation of the electric meter to a head-end system.

2. The method of claim 1, wherein determining the initial orientation of the electric meter comprises executing a firmware procedure to initiate the initial acceleration measurements on the electric meter during installation.

3. The method of claim 1, wherein determining the initial orientation of the electric meter comprises initiating the initial acceleration measurements from the accelerometer by the electric meter when the electric meter first registers on a network and transitions to an operational mode at an installation site.

4. The method of claim 1, wherein continuously monitoring the subsequent acceleration measurements from the accelerometer comprises receiving acceleration measurements from the accelerometer at predetermined time intervals.

5. The method of claim 1, wherein determining the differences between the initial orientation and the subsequent orientations comprises determining differences between the initial acceleration measurements and the subsequent acceleration measurements.

6. The method of claim 1, wherein determining a difference between the initial orientation and the subsequent orientations comprises:
    determining an initial tilt angle of the electric meter based on the initial acceleration measurements, determining a subsequent tilt angles of the electric meter based on the subsequent acceleration measurements, and comparing the initial tilt angle to the subsequent tilt angles.

7. The method of claim 6, further comprising:

determining tilt angle differences of the electric meter at predetermined time intervals when subsequent acceleration measurements from the accelerometer are received.

8. The method of claim 6, wherein a tilt angle of the electric meter is an angle in a front-to-back direction with respect to a front face of the electric meter, an angle in a side-to-side direction with respect to the front face of the electric meter, or an angle in a rotation direction around a vertical axis of the electric meter.

9. An electric meter, comprising:

an accelerometer configured to:

obtain initial acceleration measurements of the electric meter due to gravity; and obtain subsequent acceleration measurements of the electric meter due to gravity over time; and a processor in communication with the accelerometer, wherein the processor is configured to:

receive the initial acceleration measurements and the subsequent acceleration measurements from the accelerometer;

determine an initial of the electric meter based on the initial acceleration measurements;

determine subsequent orientations of the electric meter based on the subsequent acceleration measurements obtained within a specified period of time;

determine differences between the initial orientation and the subsequent orientations based on the initial acceleration measurements and the subsequent acceleration measurements obtained within the specified period of time;

compare the differences to threshold values;

determine that the differences exceed the threshold values;

based on the differences exceeding the threshold values, determine that the orientation of the electric meter is oscillating, thereby straining connected electrical wiring; and generate a notification of the oscillating orientation of the electric meter to a head-end system.

10. The electric meter of claim 9, wherein the processor is further configured to determine the differences between the initial orientation and the subsequent orientations by determining differences between the initial acceleration measurements and the subsequent acceleration measurements.

11. The electric meter of claim 9, wherein the processor is further configured to determine the differences between the initial orientation and the subsequent orientations by:

determining an initial tilt angle of the electric meter based on the initial acceleration measurements, determining subsequent tilt angles of the electric meter based on the subsequent acceleration measurements, and comparing the initial tilt angle to the subsequent tilt angles.

12. The electric meter of claim 11, wherein the processor is further configured to receive the subsequent acceleration measurements at predetermined time intervals.

13. The electric meter of claim 12, wherein the processor is further configured to determine tilt angle differences at the predetermined time intervals when the subsequent acceleration measurements from the accelerometer are received.

14. The electric meter of claim 11, wherein a tilt angle of the electric meter is an angle in a front-to-back direction with respect to a front face of the electric meter or an angle in a side-to-side direction with respect to the front face of the electric meter.

15. The electric meter of claim 11, wherein a tilt angle of the electric meter is an angle in a rotation direction around a vertical axis of the electric meter.

16. A system comprising:

a head-end system including a server; and an electric meter in communication with the head-end system, the electric meter comprising:

an accelerometer configured to:

obtain initial acceleration measurements of the electric meter due to gravity; and obtain subsequent acceleration measurements of the electric meter due to gravity over time; and a processor in communication with the accelerometer, wherein the processor is configured to:

receive the initial acceleration measurements and the subsequent acceleration measurements from the accelerometer;

determine an initial orientation of the electric meter based on the initial acceleration measurements;

determine subsequent orientations of the electric meter based on the subsequent acceleration measurements obtained within a specified period of time;

determine differences between the initial orientation and the subsequent orientations based on the initial acceleration measurements and the subsequent acceleration measurements obtained within the specified period of time;

compare the differences to threshold values;

determine that the differences exceed the threshold values;

based on the differences exceeding the threshold values, determine that the orientation of the electric meter is oscillating, thereby straining connected electrical wiring; and generate a notification of the oscillating orientation of the electric meter to the server of the head-end system.

17. The system of claim 16, wherein the processor is further configured to determine the difference between the initial orientation and the subsequent orientations by determining differences between the initial acceleration measurements and the subsequent acceleration measurements.

18. The system of claim 16, wherein the processor is further configured to determine the differences between the initial orientation and the subsequent orientations by:

determining an initial tilt angle of the electric meter based on the initial acceleration measurements, determining subsequent tilt angles of the electric meter based on the subsequent acceleration measurements, and comparing the initial tilt angle to the subsequent tilt angles.

19. The system of claim 18, wherein the processor is further configured to receive the subsequent acceleration measurements at predetermined time intervals.

20. The system of claim 19, wherein the processor is further configured to determine tilt angle differences at the predetermined time intervals when the subsequent acceleration measurements from the accelerometer are received.

\* \* \* \* \*